(12) United States Patent
Chang

(10) Patent No.: US 9,318,472 B1
(45) Date of Patent: Apr. 19, 2016

(54) LIGHT-EMITTING DIODE LIGHTING DEVICE

(71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/527,783

(22) Filed: Oct. 30, 2014

(51) Int. Cl.

| | |
|---|---|
| *H01L 25/075* | (2006.01) |
| *H01L 33/42* | (2010.01) |
| *H01L 33/40* | (2010.01) |
| *H01L 33/50* | (2010.01) |
| *H01L 33/52* | (2010.01) |

(52) U.S. Cl.
CPC .......... *H01L 25/0753* (2013.01); *H01L 33/405* (2013.01); *H01L 33/42* (2013.01); *H01L 33/50* (2013.01); *H01L 33/52* (2013.01)

(58) Field of Classification Search
CPC ..... H01L 27/15; H01L 27/153; H01L 27/156; H01L 27/32; H01L 25/0753; H01L 25/0756; H01L 33/42
See application file for complete search history.

(56) References Cited

U.S. PATENT DOCUMENTS

| | | | | |
|---|---|---|---|---|
| 2006/0017372 A1* | 1/2006 | Chu | ........................ | H01L 33/38 313/498 |
| 2007/0290217 A1* | 12/2007 | Daniels | ............. | G02F 1/133603 257/88 |
| 2010/0237381 A1* | 9/2010 | Kamiya | .................. | H01L 33/42 257/99 |
| 2010/0291374 A1* | 11/2010 | Akarsu | .................. | B82Y 20/00 428/328 |
| 2013/0264592 A1* | 10/2013 | Bergmann | .............. | H01L 33/50 257/88 |
| 2014/0209930 A1* | 7/2014 | Weng | .................. | H01L 25/0753 257/88 |

* cited by examiner

*Primary Examiner* — Joshua King
(74) *Attorney, Agent, or Firm* — CKC & Partners Co., Ltd.

(57) ABSTRACT

A light-emitting diode (LED) lighting device includes a substrate, a first bottom electrode, a bottom transparent isolation layer, a first vertical LED, a second vertical LED, a first top transparent electrode, and a second top transparent electrode. The first bottom electrode is disposed on the substrate and is reflective. The first vertical LED and the second vertical LED are disposed on the first bottom electrode. The bottom transparent isolation layer covers the substrate and the first bottom electrode and exposes the first vertical LED and the second vertical LED. The first top transparent electrode is electrically connected to the first vertical LED. The second top transparent electrode is electrically connected to the second vertical LED. The first top transparent electrode, the second top transparent electrode, and the first bottom electrode cooperate to electrically connect the first vertical LED and the second vertical LED in series.

18 Claims, 8 Drawing Sheets

LIGHT-EMITTING DIODE LIGHTING DEVICE

BACKGROUND

In recent years, light-emitting diode (LED) technologies have improved a lot, and LEDs with high power and high brightness have been presented to the market. In addition, the LEDs used as light bulbs have the advantage of long lifetime. Therefore, such LED light bulbs have the tendency to replace other conventional light sources. LEDs can be applied to various types of lamps, such as traffic lights, street lights, and flashlights.

Since LEDs gradually become mainstream light sources, improving properties of LEDs becomes an important issue, and this becomes the main goal in the R&D departments of the LED industries.

SUMMARY

This disclosure provides a light-emitting diode (LED) lighting device to achieve high power, high luminous efficiency, and longer lifetime.

In one aspect of the disclosure, a LED lighting device is provided. The LED lighting device includes a substrate, at least one first bottom electrode, a bottom transparent isolation layer, at least one first vertical LED, at least one second vertical LED, a first top transparent electrode, and a second top transparent electrode. The first bottom electrode is disposed on the substrate, in which the first bottom electrode is reflective. The bottom transparent isolation layer covers the substrate, in which the bottom transparent isolation layer has a first opening and a second opening therein to respectively expose at least a first part and a second part of the first bottom electrode. The first vertical LED is disposed on the first exposed part of the first bottom electrode. The second vertical LED is disposed on the second exposed part of the first bottom electrode. The first top transparent electrode is electrically connected to the first vertical LED. The second top transparent electrode is electrically connected to the second vertical LED, in which the first top transparent electrode, the second top transparent electrode, and the first bottom electrode cooperate to electrically connect the first vertical LED and the second vertical LED in series.

By electrically connecting the first vertical LED and the second vertical LED in series, the LED lighting device can achieve high power and high luminous efficiency by electrically connecting to a power supply with high voltage. In addition, the current passing the first vertical LED and the second vertical LED needs not to be large to achieve high power and high luminous efficiency. Therefore, the lifetime of the first vertical LED and the second vertical LED may be longer, and cooling may not become a problem.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
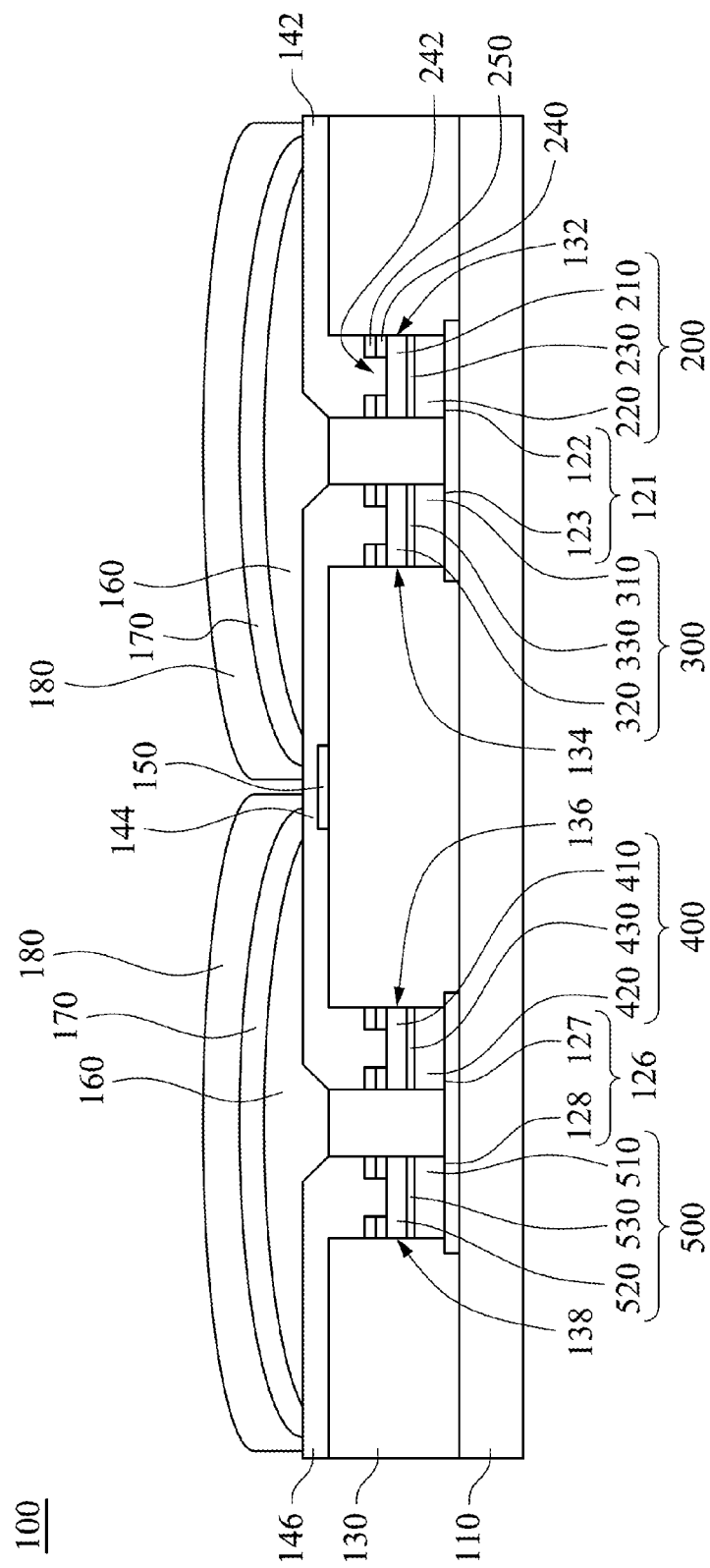
FIG. 1 is a schematic cross-sectional view of a light-emitting diode (LED) lighting device according to one embodiment of this disclosure.

FIG. 1 is a schematic cross-sectional view of a light-emitting diode (LED) lighting device 100 according to one embodiment of this disclosure. As shown in FIG. 1, an LED lighting device 100 is provided. The LED lighting device 100 includes a substrate 110, a bottom electrode 121, a bottom transparent isolation layer 130, vertical LEDs 200 and 300, and top transparent electrodes 142 and 144. The bottom electrode 121 is disposed on the substrate 110, and the bottom electrode 121 is reflective. The bottom transparent isolation layer 130 covers the substrate 110, and the bottom transparent isolation layer 130 has openings 132 and 134 therein to respectively expose at least parts 122 and 123 of the bottom electrode 121. The vertical LEDs 200 and 300 are respectively disposed on the exposed parts 122 and 123 of the bottom electrode 121. The top transparent electrodes 142 and 144 are respectively electrically connected to the vertical LEDs 200 and 300. The top transparent electrodes 142 and 144 and the bottom electrode 121 cooperate to electrically connect the vertical LEDs 200 and 300 in series.

By electrically connecting the vertical LEDs 200 and 300 in series, the LED lighting device 100 can achieve high power and high luminous efficiency. In addition, the current passing through the vertical LEDs 200 and 300 can remain small to enhance the lifetime of the vertical LEDs 200 and 300 and reduce heat generated by the vertical LEDs 200 and 300.

Specifically, for example, if the voltage difference of each of the vertical LEDs 200 and 300 is 3.125 volts and the current passing through the vertical LEDs 200 and 300 is 1 ampere, the power of the combination of the vertical LEDs 200 and 300 is 6.25 watts. If a single LED is used to achieve the same power, the current should be 2 amperes. As a result, the single LED may have a shorter lifetime due to the larger passing current, and the cooling of the single LED may also be more difficult.

Because the LED lighting device 100 employs the top transparent electrodes 142 and 144 as its top electrode to interconnect different electronic components, a wire bonding process may not be needed. Therefore, the process yield of the LED lighting device 100 is improved, and the manufacturing cost of the LED lighting device 100 is lowered.

The substrate 110 has a high thermal conductivity. Specifically, the substrate 110 is made of silicon, such as undoped silicon, p-type silicon, or n-type silicon, or a ceramic material.

When the substrate 110 is made of silicon, the potential of the substrate 110 may be operated to be the lowest among all elements of the LED lighting device 100, such that the contact surface of the substrate 110 and the conductive elements above the substrate 110 (for example, the bottom electrode 121 or the top transparent electrodes 142) totally or partially form a reverse bias of p-n junction. Therefore, the substrate 110 is electrically insulated from the conductive elements above the substrate 110.

Figure 2:
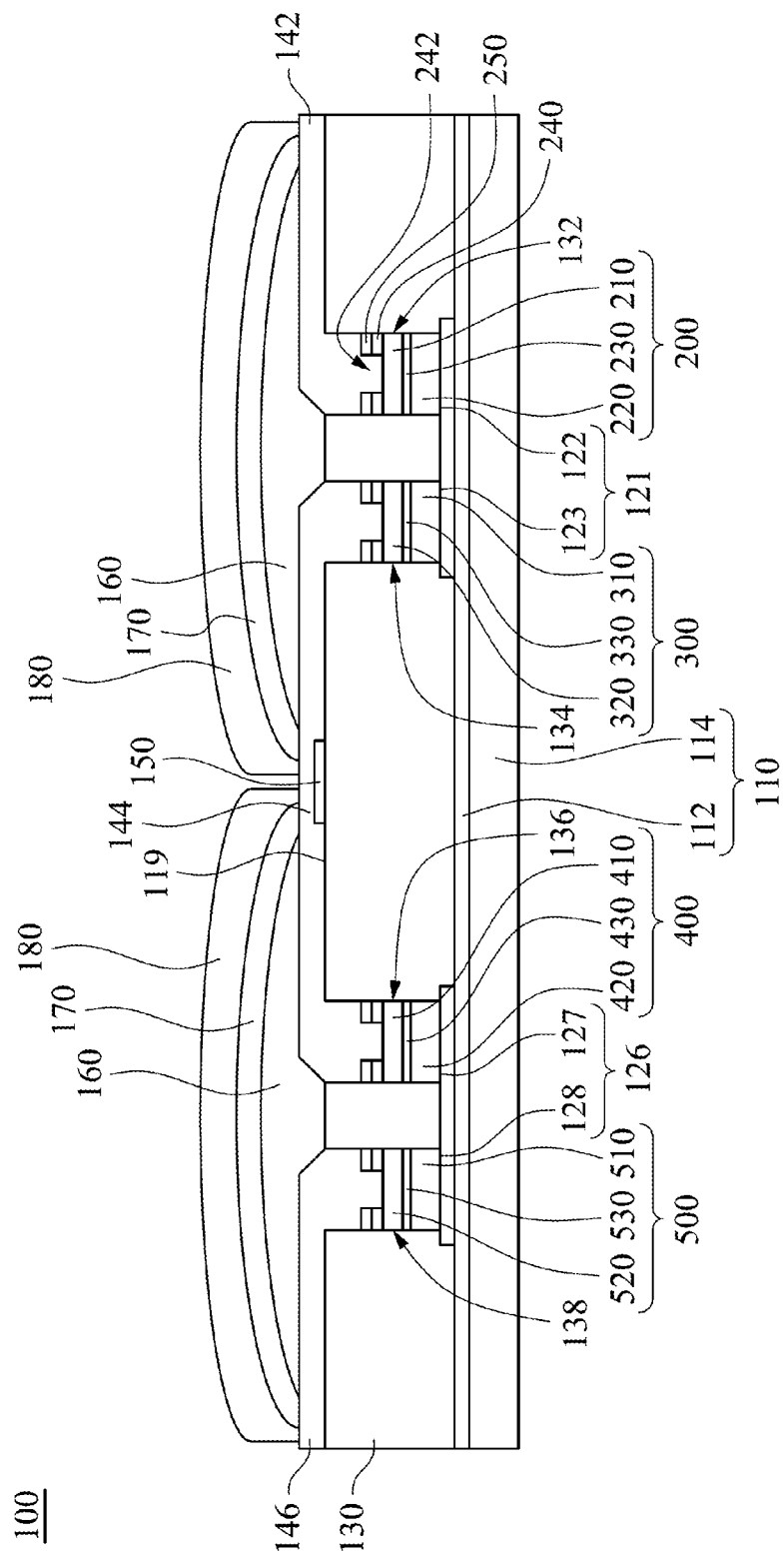
FIG. 2 is a schematic cross-sectional view of the LED lighting device according to another embodiment of this disclosure.

Embodiments of this disclosure are not limited thereto. FIG. 2 is a schematic cross-sectional view of the LED lighting device 100 according to another embodiment of this disclosure. As shown in FIG. 2, the substrate 110 includes an insulation layer 112 and a conductive layer 114. The insulation layer 112 may be made of silicon dioxide ($SiO_2$), which may be oxidized from silicon. The conductive layer 114 may be made of metal such as aluminium, and the conductive layer 114 may function as a heat-dissipating layer.

The potential of the substrate 110 may be operated to be the intermediate value of the maximum potential and the minimum potential among all elements of the LED lighting device 100, such that the potential differences between the substrate 110 and the conductive elements above the substrate 110 (for example, the bottom electrode 121 or the top transparent electrodes 142) are not too large. Therefore, the current does not pass through the insulation layer 112, and thus the substrate 110 is electrically insulated from the conductive elements above the substrate 110.

The bottom electrode 121 is made of metal, such as silver. Embodiments of this disclosure are not limited thereto. In other embodiments, the bottom electrode 121 is a multi-layer structure. For example, the bottom electrode 121 is a double-layer structure made of copper and silver or a triple-layer structure made of copper, titanium, and silver. The bottom electrode 121 functions as a reflective layer to reflect light emitted from the vertical LEDs 200 and 300 to forward upwardly.

The vertical LEDs 200 and 300 are in reversed electricity polarity. Specifically, the vertical LED 200 further includes a first semiconductor layer 210 proximal to the top transparent electrode 142 and a second semiconductor layer 220 proximal to the bottom electrode 121. The vertical LED 300 further includes a first semiconductor layer 310 proximal to the bottom electrode 121 and a second semiconductor layer 320 proximal to the top transparent electrode 144. The first semiconductor layers 210 and 310 of the vertical LEDs 200 and 300 are of the same type, and the second semiconductor layers 220 and 320 of the vertical LEDs 200 and 300 are of the same type.

More specifically, the first semiconductor layers 210 and 310 of the vertical LEDs 200 and 300 are n-type semiconductor layers, and the second semiconductor layers 220 and 320 of the vertical LEDs 200 and 300 are p-type semiconductor layers. Embodiments of this disclosure are not limited thereto. In other embodiments, the first semiconductor layers 210 and 310 of the vertical LEDs 200 and 300 are p-type semiconductor layers, and the second semiconductor layers 220 and 320 of the vertical LEDs 200 and 300 are n-type semiconductor layers.

The first semiconductor layers 210 and 310 and the second semiconductor layers 220 and 320 can be made of gallium nitride (GaN). People having ordinary skill in the art can make proper modifications to the material of the first semiconductor layers 210 and 310 and the second semiconductor layers 220 and 320 depending on the actual application.

The vertical LED 200 further includes an active layer 230 disposed between the first semiconductor layer 210 and the second semiconductor layer 220. The vertical LED 300 further includes an active layer 330 disposed between the first semiconductor layer 310 and the second semiconductor layer 320. Specifically, the active layer 230 and 330 can be multiple-quantum-well structures.

The bottom transparent isolation layer 130 has a high refractive index. Specifically, the refractive index of the bottom transparent isolation layer 130 is larger than 1.5. The bottom transparent isolation layer 130 may reduce total reflection in the vertical LEDs 200 and 300 and thus enhance the light extraction of the vertical LEDs 200 and 300.

The top transparent electrodes 142 and 144 are made of indium tin oxide (ITO). People having ordinary skill in the art can make proper modifications to the material of the top transparent electrodes 142 and 144 depending on the actual application.

The top transparent electrodes 142 and 144 may be patterned from a transparent conductive layer. The patterning of top transparent electrodes 142 and 144 is performed by a developing and etching process or a screen printing and etching process.

The LED lighting device 100 further includes a bottom electrode 126 disposed on the substrate 110, vertical LEDs 400 and 500, and top transparent electrode 146. The bottom transparent isolation layer 130 further has openings 136 and 138 therein to expose at least parts 127 and 128 of the bottom electrode 126. The vertical LEDs 400 and 500 disposed on the exposed parts 127 and 128 of the bottom electrode 126. The top transparent electrode 144 is further electrically connected to the vertical LED 400. The top transparent electrode 146 is electrically connected to the vertical LED 500. The bottom electrodes 121 and 126 and the top transparent electrodes 142, 144, and 146 cooperate to electrically connect the vertical LEDs 200, 300, 400, and 500 in series.

The vertical LEDs 300 and 400 are in reversed electricity polarity. Specifically, the vertical LED 400 includes a first semiconductor layer 410 proximal to the top transparent electrode 144 and a second semiconductor layer 420 proximal to the bottom electrode 126. The first semiconductor layers 310 and 410 of the vertical LEDs 300 and 400 are of the same type, and the second semiconductor layers 320 and 420 of the vertical LEDa 300 and 400 are of the same type.

The vertical LEDs 400 and 500 are in reversed electricity polarity. The vertical LED 500 further includes a first semiconductor layer 510 proximal to the bottom electrode 126 and a second semiconductor layer 520 proximal to the top transparent electrode 146. The first semiconductor layers 410 and 510 of the vertical LEDs 400 and 500 are of the same type, and the second semiconductor layers 420 and 520 of the vertical LEDs 400 and 500 are of the same type.

Figure 3A:
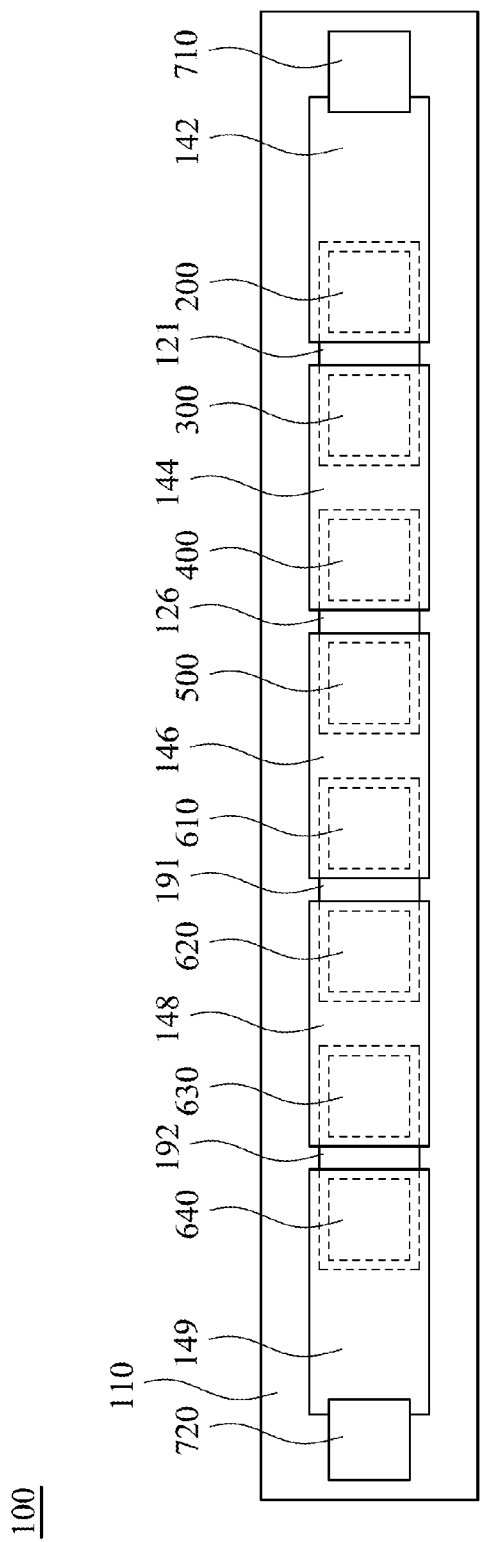
FIG. 3A is a schematic top view of the LED lighting device according to one embodiment of this disclosure.

Similarly, the LED lighting device 100 may further includes additional bottom electrodes, top transparent electrodes, and vertical LEDs, and all of the vertical LEDs are electrically connected to each other in series via the bottom electrodes and the top transparent electrodes. FIG. 3A is a schematic top view of the LED lighting device 100 according to one embodiment of this disclosure. For example, as shown in FIG. 3A, the LED light device 100 further includes bottom electrodes 191 and 192, top transparent electrodes 148 and 149, and vertical LEDs 610, 620, 630, and 640, and the vertical LEDs 200, 300, 400, 500, 610, 620, 630, and 640 are electrically connected to each other in series via the bottom electrodes 121, 126, 191, and 192 and the top transparent electrodes 142, 144, 146, 148, and 149.

The LED lighting device 100 further includes an input electrode 710 and an output electrode 720 respectively electrically connected to the top transparent electrodes 142 and 149 for allowing a power supply to be electrically connected thereto. The input electrode 710 and the output electrode 720 are single-layer structures or multi-layer structures, and the input electrode 710 and the output electrode 720 are made of conductive materials. For example, the input electrode 710 and the output electrode 720 are single-layer structures made of silver, double-layer structures made of copper and silver, or triple-layer structures made of copper, titanium, and silver. In addition, the input electrode 710, the output electrode 720, and the bottom electrodes 121, 126, 191, and 192 may be formed in the same process.

Figure 3B:
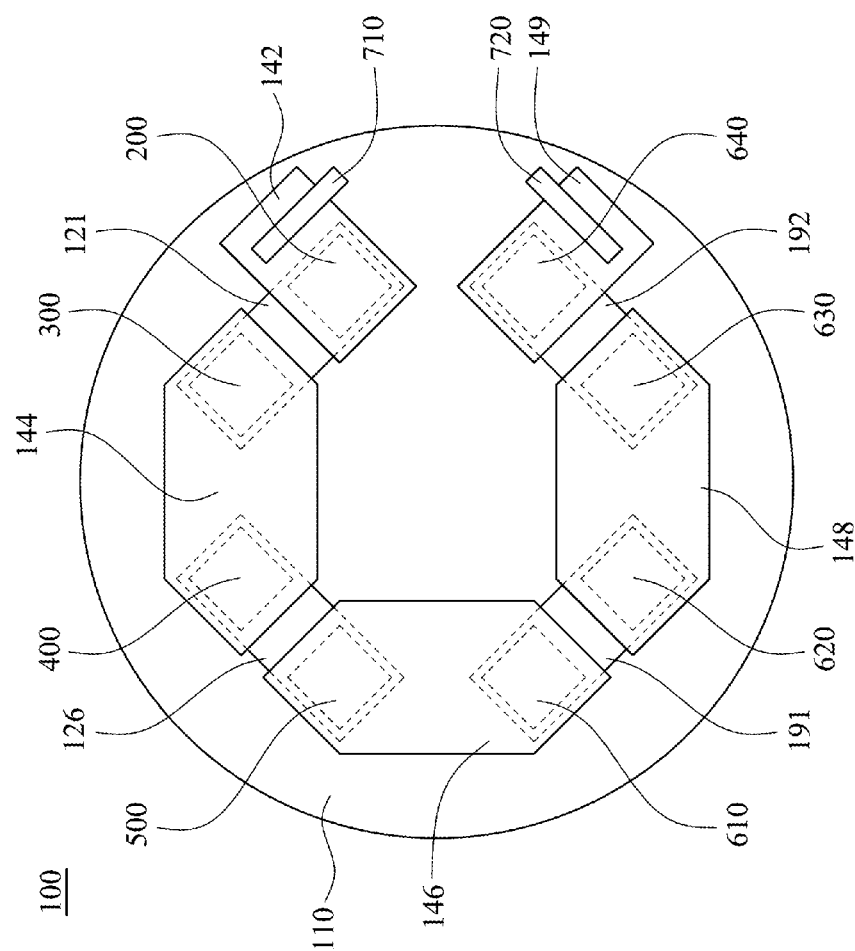
FIG. 3B is a schematic top view of the LED lighting device according to another embodiment of this disclosure.

Specifically, the shape of the substrate 110 is a cuboid, and the bottom electrodes, top transparent electrodes, and vertical LEDs are disposed in a line. Embodiments of this disclosure are not limited thereto. The shape of the substrate 110 may be a cylindrical column, a triangular prism, a cube, a cuboid, a hexagonal column, an octagonal column, or a polygon column. FIG. 3B is a schematic top view of the LED lighting device 100 according to another embodiment of this disclosure. For example, as shown in FIG. 3B, the shape of the substrate 110 is a cylindrical column, and the bottom electrodes, top transparent electrodes, and vertical LEDs are disposed in a ring.

Similarly, the shape of the bottom electrode 122, 124, 126, 191, and 192 may be a cylindrical column, a cube, a cuboid, a dumbbell-shaped column, or a polygon column. The shape of the LEDs 200, 300, 400, 500, 610, 620, 630, and 640 may be a cylindrical column, a cube, a cuboid, a hexagonal column, an octagonal column, or a polygon column. The shape of the top transparent electrodes 142, 144, 146, 148, and 149 may be a cylindrical column, a cube, a cuboid, a hexagonal column, an octagonal column, or a polygon column. The shape of the input electrode 710 and the output electrode 720 may be a cylindrical column, a cube, a cuboid, a hexagonal column, an octagonal column, or a polygon column.

As shown in FIG. 1, the vertical LED 200 further includes a patterned dielectric layer 240. The patterned dielectric layer 240 is disposed between the first semiconductor layer 210 and the top transparent electrode 142. The patterned dielectric layer 240 covers an edge portion of the first semiconductor layer 210 and has an opening 242. The top transparent electrode 142 is electrically connected to the vertical LED 200 through the opening 242. The function of the patterned dielectric layer 240 is to prevent the surface recombination of the vertical LED 200 and to prevent the leakage of the current through the side surface of the vertical LED 200, thereby enhancing the luminous efficiency of the vertical LED 200.

Specifically, the patterned dielectric layer 240 is made of silicon nitride or silicon dioxide. The patterning of the patterned dielectric layer 240 is performed by a developing and etching process or a screen printing and etching process.

The vertical LED 200 further includes a guard ring 250 disposed on the patterned dielectric layer 240. The function of the guard ring 250 is to prevent electrostatic discharge (ESD) and to make the current in the top transparent electrode 142 spread and evenly enter the vertical LED 200.

Specifically, the guard ring 250 is made of metal, such as silver. The patterning of the guard ring 250 is performed by a developing and etching process or a screen printing and etching process. If the shapes of the horizontal cross-sections of the patterned dielectric layer 240 and the guard ring 250 are the same, the patterning of the guard ring 250 may be used as the mask of the patterned dielectric layer 240.

Figure 4C:
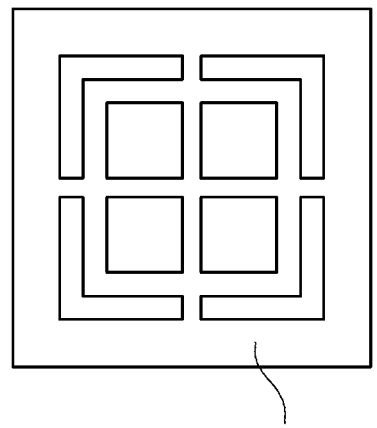
FIGS. 4A to 4C are horizontal cross-sectional views of a patterned dielectric layer according to different embodiments of this disclosure.
Figure 4B:
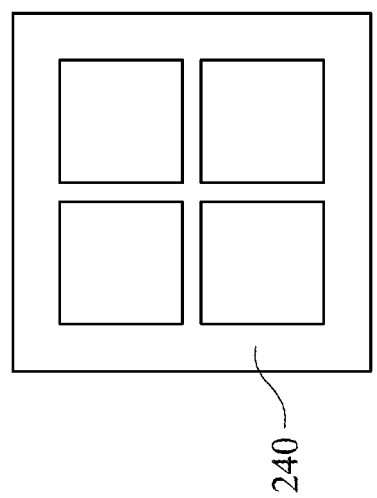
Figure 4A:
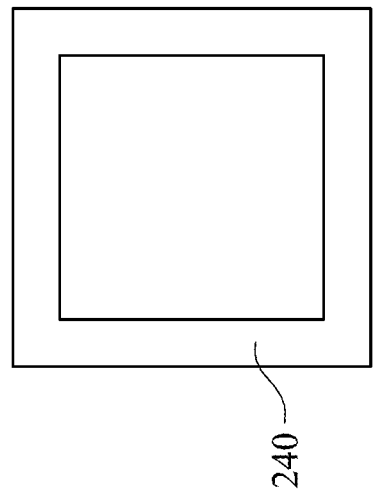

FIGS. 4A to 4C are horizontal cross-sectional views of the patterned dielectric layer 240 according to different embodiments of this disclosure. As shown in FIGS. 4A to 4C, the shape of the horizontal cross-section of the patterned dielectric layer 240 may be a ring, a ring with a cross, or a plurality of rings with a cross. The shape of the horizontal cross-section of guard ring 250 may be similar to the shape of the horizontal cross-section of the patterned dielectric layer 240. Specifically, the shape of the horizontal cross-section of guard ring 250 may be a ring, a ring with a cross, or a plurality of rings with a cross.

As shown in FIG. 1, other vertical LEDs such as vertical LED 300 or 400 may have patterned dielectric layer and the guard ring similar to the vertical LED 200 as well.

The LED lighting device 100 further includes an auxiliary electrode 150 disposed between the vertical LED 300 and the vertical LED 400 (or the opening 134 and the opening 136) and electrically coupled with the top transparent electrode 144. The auxiliary electrode 150 is made of metal. The function of the auxiliary electrode 150 is to enhance the conductivity of the top transparent electrode 144.

The auxiliary electrode 150 is isolated from the bottom electrodes 121 and 126. The patterning of the auxiliary electrode 150 is performed by a developing and etching process or a screen printing and etching process.

The LED lighting device 100 further includes at least one top transparent isolation layer 160 covering at least one of the vertical LEDs 200, 300, 400, and 500. The top transparent isolation layer 160 has a high refractive index. Specifically, the refractive index of the top transparent isolation layer is greater than 1.5. The top transparent isolation layer 160 may reduce total reflection in the LED light device 100 and thus enhance the light extraction of the vertical LEDs 200, 300, 400, and 500.

Specifically, a part of the top transparent isolation layer 160 covers the vertical LED 200 and 300, and another part of top transparent isolation layer 160 covers the vertical LEDs 400 and 500.

In some embodiments, the number of the top transparent isolation layers 160 is at least two, and the top transparent isolation layers 160 are stacked. The refractive indices of the top transparent isolation layers 160 increase toward the vertical LEDs 200 and 300 or the vertical LEDs 400 and 500, and the number of the top transparent isolation layers 160 is up to 5.

The material of the top transparent isolation layer 160 may be the same as the material of the bottom transparent isolation layer 130. People having ordinary skill in the art can make proper modifications to the material of the top transparent isolation layer 160 depending on the actual application.

The LED lighting device 100 further includes a phosphor layer 170 disposed on the top transparent isolation layer 160 and covering at least one of the vertical LEDs 200, 300, 400, and 500.

Specifically, a part of the phosphor layer 170 covers the vertical LED 200 and 300, and another part of the phosphor layer 170 covers the vertical LEDs 400 and 500.

The refractive index of the bottom transparent isolation layer 130 is greater than or equal to the refractive index of the phosphor layer 170, and the refractive index of the top transparent isolation layer 160 is greater than or equal to the refractive index of the phosphor layer 170.

The top transparent isolation layer 160 is shaped to allow optical path lengths from at least one of the vertical LEDs 200, 300, 400, and 500 through different portions of the phosphor layer 170 to be substantially the same. Specifically, the top transparent isolation layer 160 is substantially dome shaped. Therefore, the color of the light passing the phosphor layer 170 is even. The situation that the color of some of the light passing the phosphor layer 170 is yellowish and the color of the other of the light passing the phosphor layer 170 is bluish is avoided.

Figure 5:
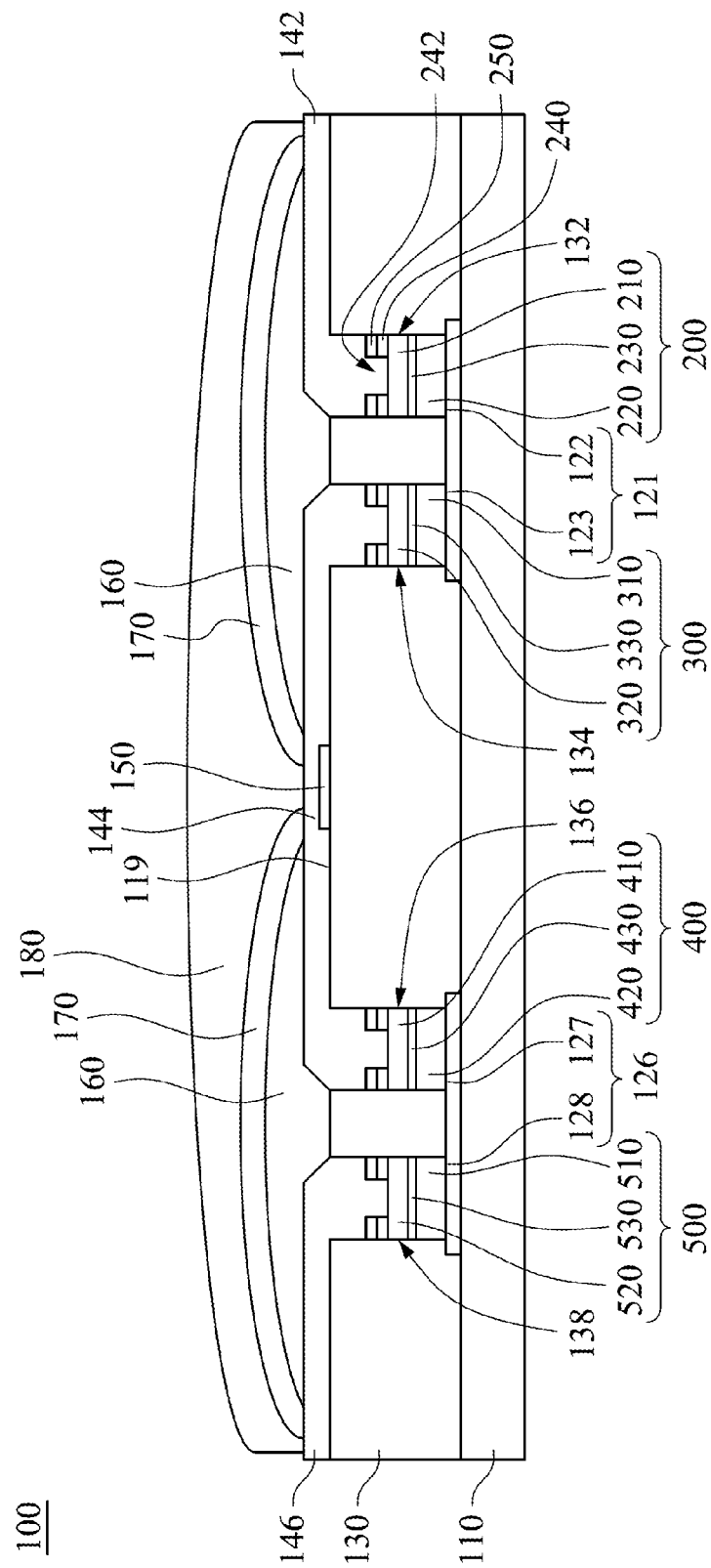
FIG. 5 is a schematic cross-sectional view of the LED lighting device according to another embodiment of this disclosure.

The LED lighting device 100 further includes an encapsulation layer 180 disposed on the phosphor layer 170. The encapsulation layer 180 covers at least one of the vertical LEDs 200, 300, 400, and 500. Specifically, a part of the encapsulation layer 180 covers the vertical LEDs 200 and 300, and another part of the encapsulation layer 180 covers the vertical LEDs 400 and 500. Embodiments of this disclosure are not limited thereto. FIG. 5 is a schematic cross-sectional view of the LED lighting device 100 according to another embodiment of this disclosure. As shown in FIG. 5, the encapsulation layer 180 integrally covers the vertical LEDs 200, 300, 400 and 500.

Figure 6:
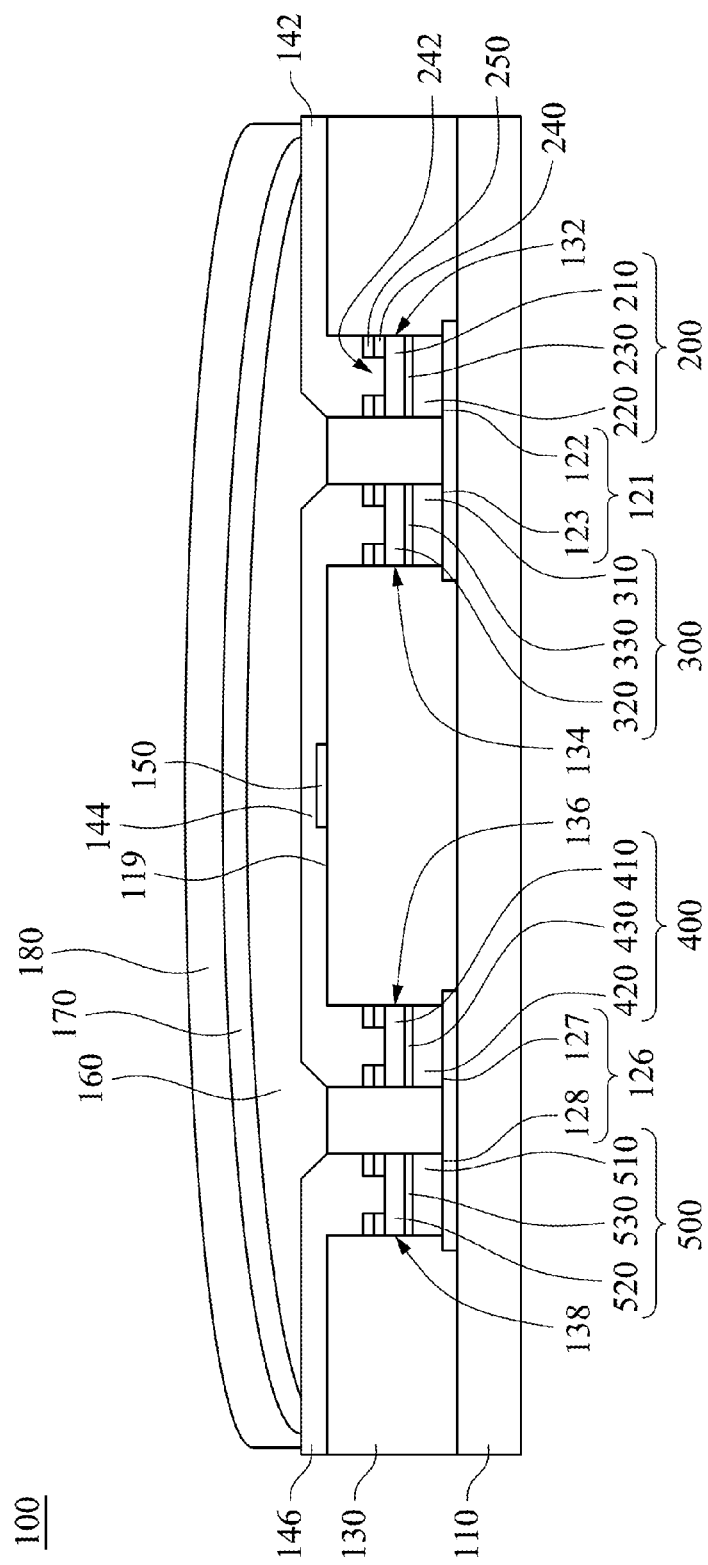
FIG. 6 is a schematic cross-sectional view of the LED lighting device according to another embodiment of this disclosure.

FIG. 6 is a schematic cross-sectional view of the LED lighting device 100 according to another embodiment of this disclosure. As shown in FIG. 6, the top transparent isolation layer 160 integrally covers the vertical LEDs 200, 300, 400 and 500. The phosphor layer 170 integrally covers the vertical LEDs 200, 300, 400 and 500. The encapsulation layer 180 integrally covers the vertical LEDs 200, 300, 400 and 500.

Figure 7:
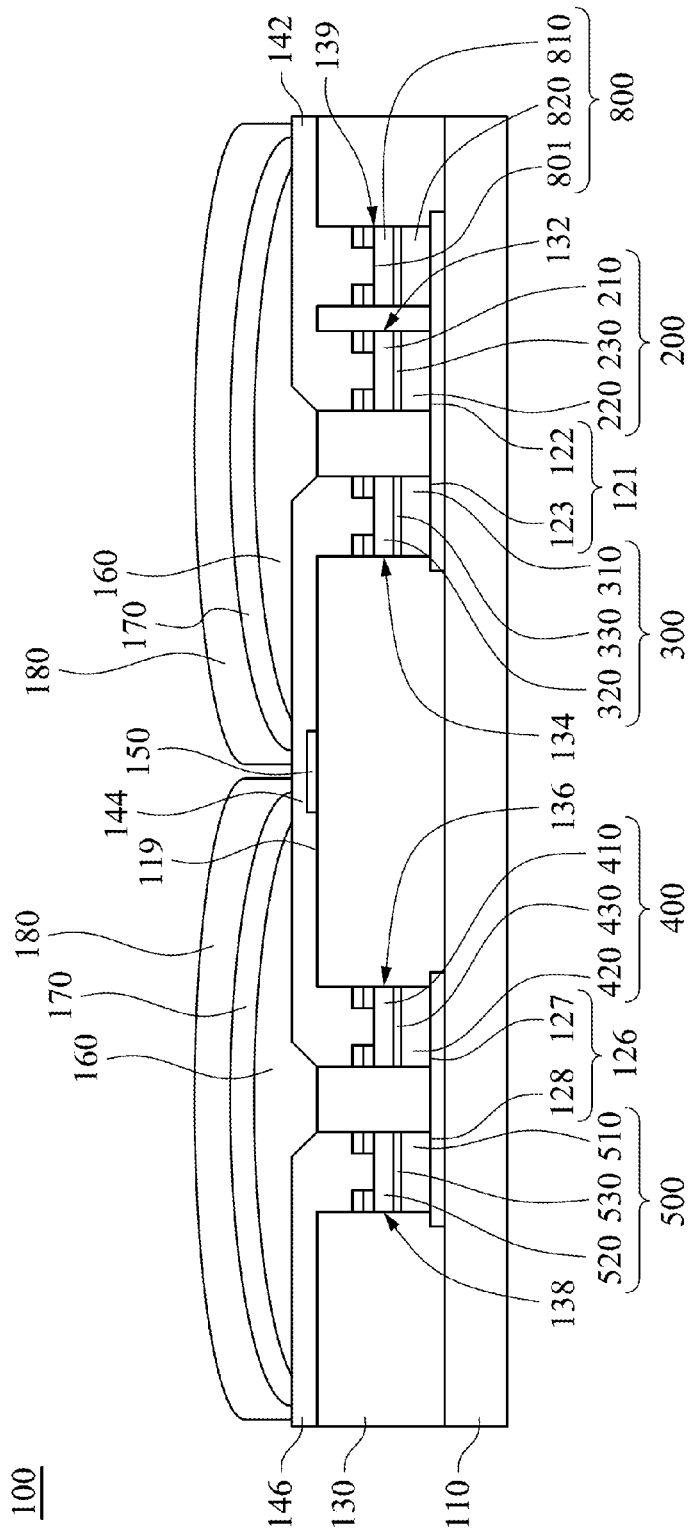
FIG. 7 is a schematic cross-sectional view of the LED lighting device according to another embodiment of this disclosure.

Each of the aforementioned vertical LEDs may be electrically connected to additional vertical LEDs in parallel via the top transparent electrode and the bottom electrode. FIG. 7 is a schematic cross-sectional view of the LED lighting device 100 according to another embodiment of this disclosure. For example, as shown in FIG. 7, the LED lighting device 100 further includes a vertical LED 800 disposed on the bottom electrode 121. The bottom transparent isolation layer 130 further has an opening 139 therein to expose at least a part 801 of the vertical LED 800, the top transparent electrode 142 is further electrically connected to the vertical LED 800 through the opening 139, and the top transparent electrode 142 and the bottom electrode 121 cooperate to electrically connect the vertical LEDs 200 and 800 in parallel.

Specifically, The vertical LED 800 includes a first semiconductor layer 810 proximal to the top transparent electrode 142 and a second semiconductor layer 820 proximal to the bottom electrode 121. The first semiconductor layers 210 and 810 of the vertical LEDs 200 and 800 are of the same type, and the second semiconductor layers 220 and 820 of the vertical LEDs 200 and 800 are of the same type.

Additionally, the number of the vertical LEDs on the bottom electrode 121 and the number of the vertical LEDs on the bottom electrode 126 may be the same or different. For example, as shown in FIG. 1, the number of the vertical LEDs on the bottom electrode 121 is two, and the number of the vertical LEDs on the bottom electrode 126 is two as well. As shown in FIG. 7, the number of the vertical LEDs on the bottom electrode 121 is three, and the number of the vertical LEDs on the bottom electrode 126 is two.

By electrically connecting the vertical LEDs in series, the LED lighting device 100 can achieve high power and high luminous efficiency by electrically connecting to a power supply with high voltage. In addition, the current passing the vertical LEDs needs not to be large to achieve high power and high luminous efficiency. Therefore, the lifetime of the vertical LEDs may be longer, and cooling may not become a problem.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A light-emitting diode (LED) lighting device, comprising:
   a substrate;
   at least one first bottom electrode disposed on the substrate, wherein the first bottom electrode is reflective;
   a bottom transparent isolation layer covering the substrate, wherein the bottom transparent isolation layer has a first opening and a second opening therein to respectively expose at least a first part and a second part of the first bottom electrode;
   at least one first vertical LED disposed on the first exposed part of the first bottom electrode;
   at least one second vertical LED disposed on the second exposed part of the first bottom electrode, wherein the other part of the first bottom electrode surrounds the first part and the second part of the first bottom electrode and is configured to reflect light emitted from the first vertical LED and the second vertical LED;
   a first top transparent electrode electrically connected to the first vertical LED;
   a second top transparent electrode electrically connected to the second vertical LED, wherein the first top transparent electrode, the second top transparent electrode, and the first bottom electrode cooperate to electrically connect the first vertical LED and the second vertical LED in series;
   a second bottom electrode disposed on the substrate, wherein the bottom transparent isolation layer has a third opening therein to expose at least a part of the second bottom electrode;
   at least one third vertical LED disposed on the exposed part of the second bottom electrode, wherein the second top transparent electrode is further electrically connected to the third vertical LED, and the first bottom electrode, the second top transparent electrode, and the second bottom electrode cooperate to electrically connect the second vertical LED and the third vertical LED in series; and
   at least one auxillary electrode disposed between the second vertical LED and the third vertical LED and electrically coupled with the second top transparent electrode, wherein the auxiliary electrode is made of metal.

2. The LED lighting device of claim 1, wherein the first vertical LED comprises:
   a first semiconductor layer proximal to the first top transparent electrode; and
   a second semiconductor layer proximal to the first bottom electrode; and
   the second vertical LED comprises:
   a first semiconductor layer proximal to the first bottom electrode; and
   a second semiconductor layer proximal to the second top transparent electrode, wherein the first semiconductor layers of the first vertical LED and the second vertical LED are of the same type, and the second semiconductor layers of the first vertical LED and the second vertical LED are of the same type.

3. The LED lighting device of claim 1, wherein the first bottom electrode is made of metal.

4. The LED lighting device of claim 1, wherein the second vertical LED comprises:
- a first semiconductor layer proximal to the first bottom electrode; and
- a second semiconductor layer proximal to the second top transparent electrode;

the third vertical LED comprises:
- a first semiconductor layer proximal to the second top transparent electrode; and
- a second semiconductor layer proximal to the second bottom electrode, wherein the first semiconductor layers of the second vertical LED and the third vertical LED are of the same type, and the second semiconductor layers of the second vertical LED and the third vertical LED are of the same type.

5. The LED lighting device of claim 1, wherein the auxiliary electrode is physically isolated from the first bottom electrode and the second bottom electrode.

6. The LED lighting device of claim 1, wherein the auxiliary electrode is disposed between the second opening and the third opening.

7. The LED lighting device of claim 1, wherein the first vertical LED comprises:
- a first semiconductor layer proximal to the first top transparent electrode;
- a second semiconductor layer proximal to the first bottom electrode;
- an active layer disposed between the first semiconductor layer and the second semiconductor layer; and
- a patterned dielectric layer disposed between the first semiconductor layer and the first top transparent electrode and covering an edge portion of the first semiconductor layer.

8. The LED lighting device of claim 7, wherein the first vertical LED further comprises:
- a guard ring disposed on the patterned dielectric layer.

9. The LED lighting device of claim 1, further comprising:
- at least one top transparent isolation layer covering at least one of the first vertical LED and the second vertical LED.

10. The LED lighting device of claim 9, wherein the refractive index of the bottom transparent isolation layer is greater than or equal to the refractive index of the top transparent isolation layer.

11. The LED lighting device of claim 9, wherein the refractive indices of a plurality of the top transparent isolation layers increase towards the first vertical LED and the second vertical LED.

12. The LED lighting device of claim 1, further comprising:
- a phosphor layer covering at least one of the first vertical LED and the second vertical LED.

13. The LED lighting device of claim 12, wherein the refractive index of the bottom transparent isolation layer is greater than or equal to the refractive index of the phosphor layer.

14. The LED lighting device of claim 12, wherein optical path lengths from at least one of the first vertical LED and the second vertical LED through different portions of the phosphor layer are substantially the same.

15. The LED lighting device of claim 12, further comprising:
- at least one top transparent isolation layer disposed between the phosphor layer and the bottom transparent isolation layer, wherein the top transparent isolation layer is shaped to allow optical path lengths from at least one of the first vertical LED and the second vertical LED through different portions of the phosphor layer to be substantially the same.

16. The LED lighting device of claim 15, wherein the refractive index of the top transparent isolation layer is greater than or equal to the refractive index of the phosphor layer.

17. The LED lighting device of claim 15, further comprising:
- an encapsulation layer disposed on the phosphor layer, wherein the encapsulation layer covers at least one of the first vertical LED and the second vertical LED.

18. The LED lighting device of claim 1, further comprising:
- an encapsulation layer covering at least one of the first vertical LED and the second vertical LED.

* * * * *